(12) United States Patent
Arenz et al.

(10) Patent No.: US 11,906,254 B2
(45) Date of Patent: Feb. 20, 2024

(54) HEAT SINK WITH CARBON-NANOSTRUCTURE-BASED FIBRES

(71) Applicant: Robert Bosch GmbH, Stuttgart (DE)

(72) Inventors: Christine Arenz, Stuttgart (DE); Giuseppe Buttice, Vaihingen an der Enz (DE); Reiner Ramsayer, Rutesheim (DE); Ulrike Groeger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 443 days.

(21) Appl. No.: 17/290,830

(22) PCT Filed: Oct. 14, 2019

(86) PCT No.: PCT/EP2019/077763
§ 371 (c)(1),
(2) Date: May 3, 2021

(87) PCT Pub. No.: WO2020/094340
PCT Pub. Date: May 14, 2020

(65) Prior Publication Data
US 2021/0372714 A1 Dec. 2, 2021

(30) Foreign Application Priority Data
Nov. 5, 2018 (DE) .................. 10 2018 218 832.7

(51) Int. Cl.
*F28F 21/02* (2006.01)
*D03D 15/275* (2021.01)
(Continued)

(52) U.S. Cl.
CPC .......... *F28F 21/02* (2013.01); *D03D 15/275* (2021.01); *D03D 15/37* (2021.01); *D03D 15/50* (2021.01);
(Continued)

(58) Field of Classification Search
CPC .... F28F 21/02; H01L 23/473; H01L 23/3733; D10B 2101/122; D03D 15/37; D03D 15/50; D03D 25/005; D03D 15/275
See application file for complete search history.

(56) References Cited

U.S. PATENT DOCUMENTS

| | | | |
|---|---|---|---|
| 9,091,657 B2 * | 7/2015 | Kessler | H01B 1/02 |
| 2005/0168941 A1 | 8/2005 | Sokol et al. | |

(Continued)

FOREIGN PATENT DOCUMENTS

| | | | | |
|---|---|---|---|---|
| EP | 1637828 A2 * | 3/2006 | | B82Y 30/00 |
| EP | 1637828 A2 | 3/2006 | | |

(Continued)

OTHER PUBLICATIONS

Zhang et al., "Evaluation on Heat Transferring Performance of Fabric Heat Sink by Finite Element Modeling", Journal of Textile Science and Technology, vol. 1, 2015, pp. 25-32.

(Continued)

*Primary Examiner* — Devon Russell
(74) *Attorney, Agent, or Firm* — Michael Best & Friedrich LLP

(57) ABSTRACT

The invention relates to a heat sink (1) having a main body (2) and a plurality of carbon-nanostructure-based fibres (CNB, 3), more particularly carbon nano tubes (CNT, 4) or graphene fibres, of which at least some are attached to the main body (2). According to the invention, the fibres (3, 4), by adhering to or supporting one another, form a volume structure (12), more particularly in the manner of cotton wool, felt or a spun yarn, or the fibres (3, 4) form loops (6) or a three-dimensional woven fabric.

19 Claims, 3 Drawing Sheets

(51) Int. Cl.
*D03D 15/50* (2021.01)
*D03D 25/00* (2006.01)
*D03D 15/37* (2021.01)
*H01L 23/373* (2006.01)
*H01L 23/473* (2006.01)

(52) U.S. Cl.
CPC ..... *D03D 25/005* (2013.01); *D10B 2101/122* (2013.01); *H01L 23/3733* (2013.01); *H01L 23/473* (2013.01)

(56) References Cited

U.S. PATENT DOCUMENTS

| | | | |
|---|---|---|---|
| 2005/0254208 | A1 | 11/2005 | Belady et al. |
| 2006/0231946 | A1 | 10/2006 | Pan et al. |
| 2007/0053168 | A1* | 3/2007 | Sayir ............... H01L 23/367 257/E23.105 |
| 2007/0158584 | A1 | 7/2007 | Lin |
| 2008/0170982 | A1* | 7/2008 | Zhang ............... D02G 3/44 423/447.3 |
| 2009/0282802 | A1* | 11/2009 | Cooper ............... D02G 3/16 57/244 |
| 2010/0267205 | A1 | 10/2010 | Ward et al. |
| 2010/0304101 | A1* | 12/2010 | Lin ............... B82Y 30/00 156/322 |
| 2011/0316173 | A1 | 12/2011 | Patti et al. |
| 2013/0163205 | A1* | 6/2013 | Zhang ............... H01L 23/42 361/705 |
| 2016/0130493 | A1* | 5/2016 | Hirose ............... C09K 5/14 427/249.1 |

FOREIGN PATENT DOCUMENTS

| | | | | |
|---|---|---|---|---|
| EP | 2149538 | A2 * | 2/2010 | ............ C01B 32/16 |
| EP | 2149538 | A2 | 2/2010 | |
| EP | 2187440 | A2 | 5/2010 | |
| EP | 2224199 | A1 | 9/2010 | |
| EP | 3252811 | A1 | 12/2017 | |
| JP | 2000228471 | A | 8/2000 | |
| JP | 2014220280 | A * | 11/2014 | |
| JP | 2014220280 | A | 11/2014 | |

OTHER PUBLICATIONS

Translation of International Search Report for Application No. PCT/EP2019/077763 dated Jan. 21, 2020 (3 pages).

* cited by examiner

HEAT SINK WITH CARBON-NANOSTRUCTURE-BASED FIBRES

BACKGROUND

The present invention relates to a heat sink comprising a main body and a plurality of carbon nanostructure-based fibers (CNB), in particular carbon nanotubes (CNT) or graphene fibers, at least some of which are secured to the main body for heat transfer.

US 2007158584 discloses a heat sink of the type recited at the outset. The known heat sink has a main body from which carbon nanostructure-based fibers extend in parallel with one another. The heat sink serves to cool an article joined to the main body and the carbon nanostructure-based fibers are traversed by a cooling medium. The heat from the article thus passes into the main body, from there into the carbon nanostructure-based fibers and subsequently into the cooling medium.

Such heat sinks may be employed in electronic technology, in particular in high performance electronics, in order for example to dissipate the heat formed in high performance semiconductors. It is precisely in the field of performance electronics, especially in modern inverters, where heat sinks having a high efficiency coupled with a small size are required. The invention relates to a heat sink which is simple to produce and small in size but nevertheless provides a structure having a very large surface area so that large amounts of heat may be readily dissipated.

SUMMARY

The heat sink according to the invention has a main body and a plurality of carbon nanostructure-based fibers (CNB), in particular carbon nanotubes (CNT) or graphene fibers, of which at least some are secured to the main body for heat dissipation, wherein due to mutual adhesion or support the fibers form a volume structure, in particular in the fashion of wadding, felt or a yarn, or wherein the fibers form loops or a three-dimensional fabric. The invention utilizes the specific properties of carbon nanostructure-based fibers (CNB), in particular carbon nanotubes (CNT) or graphene fibers, such as very good thermal conductivity. The volume structure of the fibers, of the loops of the fibers or of the three-dimensional fabric, ensures a very high surface area and the fibers are therefore very effective at transmitting heat to a preferably flowing cooling medium, wherein the cooling medium surrounds or traverses the fibers. The cooling medium may especially be a cooling liquid. The volume structure in which the fibers are in contact with one another to effect a manner of adhesion or support, or the loop structure of the fibers or the fabric structure of the three-dimensional fabric, results not only in the recited large surface area but simultaneously produces a relatively strong mechanical construction so that even a flowing cooling medium deforms the fibers only slightly, if at all. On the contrary the recited structures bring about very good turbulization of the flow of the cooling medium, thus ensuring better heat dissipation. The recited mutual "adhesion" of the fibers is in principle to be understood as meaning a type of frictional resistance existing between two contacting fibers for example rather than adhesive bonding or the like. Nevertheless—in another embodiment—the recited adhesion is also to be understood as meaning the bond between two contacting fibers, for example by means of an additional substance such as for example a type of adhesive or the like. Soldering sites are also conceivable. The main body is in thermal communication with an article to be cooled, preferably at least one performance semiconductor.

In a development of the invention it is provided that the fibers at least in regions form an ordered structure and/or at least in regions form an unordered structure. In the case of a wadding-like volume structure an unordered structure is present. The same applies for felt or for the yarn. In the case of looping fibers more of an ordered structure is assumed. The same applies for the recited fabric since this comprises certain ever-repeating loop patterns.

A development of the invention provides a counterbody which is a distance away from the main body and has at least some of the fibers secured to it. The securing of fibers to the main body and to the counterbody ensures that the total fiber structure is mechanically particularly well secured so that no undesired deformation due to a flowing cooling medium can occur. The cooling medium then flows between the main body and the counterbody, thus dissipating heat from the fibers disposed therebetween. The counterbody can preferably also dissipate heat.

It is preferably provided that the securing to the main body and/or to the counterbody is in the form of soldering sites, adhesive bonding sites and/or casting sites. The main body and/or the counterbody may for example be in sheet-like form, wherein the recited securing of the fibers is carried out on these sheets, or the production of the main body and/or the counterbody may comprise casting sections of the fibers thereinto by means of a casting operation.

It may especially be provided that the loops comprise end regions and that at least some of the end regions of the loops are secured to/in the main body and/or the counterbody. The end regions may be the beginning and/or the end of a loop or else a point of inflection of the loop.

It is preferably provided that the fibers are at least in regions compressed with one another. For example a cotton wadding-like structure of the fibers is generated during production and subsequently compressed to form a stronger structure, wherein the compressing is, however, not strong enough to cause excessive closure of flow paths for the cooling medium.

In order to provide a particular resistance to the flowing cooling medium, the invention may envisage providing at least some of the fibers with a mechanically stabilizing coating. For the same reason it is possible in a further development of the invention to provide at least one support structure, in particular made of metal and/or preferably further carbon nanostructure-based fibers (CNB), in particular carbon nanotubes (CNT) or graphene fibers, which supports the fibers. The support structure is thus especially a metal structure or a fiber structure, wherein this fiber structure is then in turn composed of (especially other) carbon nanostructure-based fibers or carbon nanotubes.

One development provides that the at least one support structure is grid-shaped and assists the securing to the main body and/or the counterbody, wherein it may especially be provided that the support structure is cast into the main body and/or the counterbody.

It is preferably provided that the three-dimensional fabric is mechanically stabilized by the type of loops of the fabric and/or the loop size of the fabric. This stabilization resulting from the loops also mechanically protects the carbon nanostructure-based fibers, in particular carbon nanotubes, from deformation.

It may be provided that at least some of the fibers extend from an especially sheetlike fiber basis formed by the fibers and/or further carbon nanostructure-based fibers (CNB), in particular carbon nanotubes (CNT) or graphene fibers. This fiber basis may in particular be secured to the main body and/or the counterbody or may be cast into the main body and/or the counterbody.

The recited fiber basis may especially be in the form of a fabric.

A development of the invention provides that at least some of the fibers extend from the main body to the counterbody at an angle not equal to 90° to achieve the greatest possible fiber length between these two bodies and/or at an angle of 90°. The greater the fiber length between the main body and the counterbody, the more heat may be dissipated by the individual fiber.

BRIEF DESCRIPTION OF THE DRAWINGS

The drawings elucidate the invention with reference to exemplary embodiments where.

DETAILED DESCRIPTION

Figure 1:
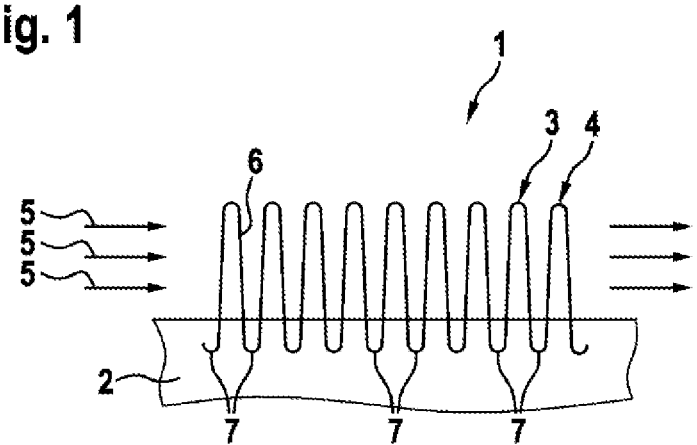
FIG. 1 shows a region of a heat sink having loop-shaped carbon nanostructure-based fibers

FIG. 1 shows a heat sink 1 which comprises a main body 2 and carbon nanostructure-based fibers 3, in particular carbon nanotubes 4, or alternatively graphene fibers. The heat sink 1 is in thermal communication with a high performance electronic component (not shown) which must be cooled in operation. A cooling medium, for example a cooling liquid, indicated with arrows 5 flows along the heat sink 1, in particular transversely to the direction of the carbon nanotubes 4. Heat from the high performance electronic component is transferred to the main body 2 and is conducted from there to the carbon nanotubes 4 and dissipated by the cooling medium. The carbon nanotubes 4 run in the form of loops 6 which form an approximately meandering structure, wherein end regions 7 of the loops 6 are embedded in the main body 2. The embedding is preferably carried out by casting during preparation of the main body 2. The main body 2 is preferably made of highly thermally conductive material, in particular metal. The loop structure of the carbon nanotubes 4 endows these with good mechanical stability with respect to the flowing cooling medium and they are therefore not deformed by the flow. The loop shape moreover results in very good heat transfer since a large surface area is generated.

Figure 2:
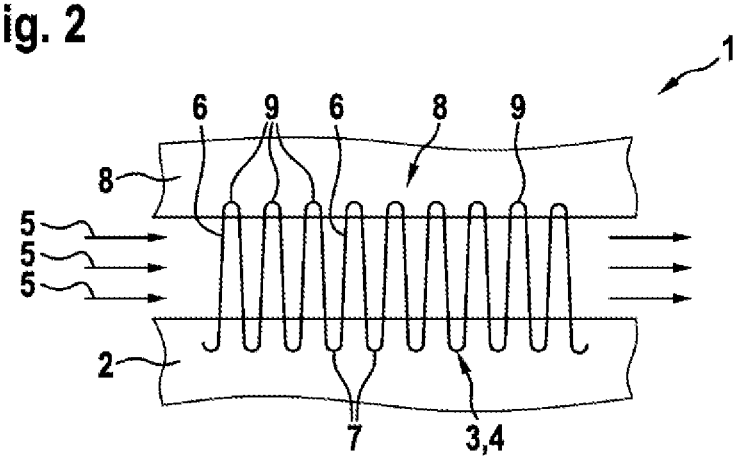
FIG. 2 shows the region of the heat sink of FIG. 1 with a region of a counterbody

FIG. 2 and all other subsequent figures use identical reference numerals as used in FIG. 1 for identical parts to avoid repeating individual elucidations. On the contrary, the corresponding passages apply. The region of the heat sink 1 in FIG. 2 is constructed in the same way as in FIG. 1 but the main body 2 additionally has a counterbody 8 a distance opposite it such that end regions 9 of the loops 6 are secured to this counterbody 8, preferably are cast thereinto. The loops 6 are therefore secured at both ends, thus ensuring even better mechanical stability. The securing of the carbon nanotubes 4 to the main body 2 and/or to the counterbody 8 may also be effected in other ways, for example in the form of soldering sites or adhesive bonding sites.

Figure 3:
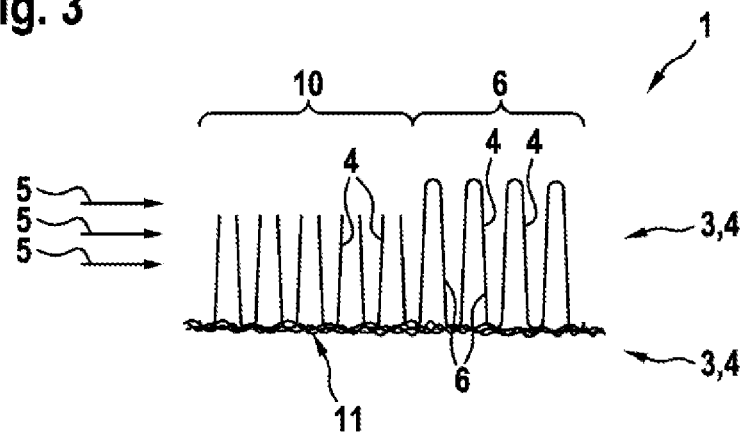
FIG. 3 shows a region of a heat sink having carbon nanostructure-based fibers in the form of individual filaments and in the form of loops

FIG. 3 shows a region of a heat sink 1 which comprises both individual filaments 10 and loops 6 in terms of the carbon nanotubes 4. Alternatively, a heat sink 1 may have only individual filaments 10 or only loops 6. The individual filaments 10 each have a kind of rod-shaped configuration. In the exemplary embodiment of FIG. 3 the carbon nanotubes 4 extend from a fiber basis 11 which is secured to the main body 2 or embedded therein (not shown). It is preferable when the carbon nanotubes 4 form not only the fiber basis 11 but also the individual filaments 10 and/or the loops 6. The fiber basis 11 may preferably be formed by intertwined or woven regions of the carbon nanotubes 4.

Figure 4:
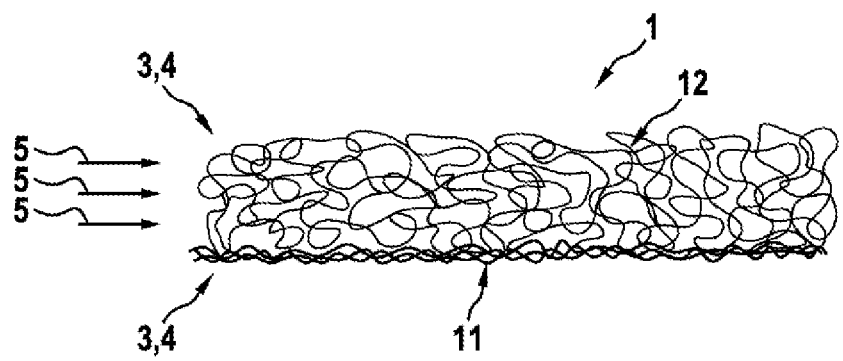
FIG. 4 shows a region of a heat sink having a fiber basis and carbon nanostructure-based fibers in the form of a volume structure, for example in the fashion of wadding or felt or of a yarn

FIG. 4 shows a region of a heat sink 1 which likewise comprises a fiber basis 11 which is preferably configured as a substantially sheetlike fabric. Similarly to the exemplary embodiment of FIG. 3 the fiber basis 11 is embedded in a main body 2 or secured thereto (not shown). The heat sink 1 of FIG. 4 further comprises carbon nanostructure-based fibers 3, in particular carbon nanotubes 4 or graphene fibers, which in this embodiment form a volume structure 12, wherein the fibers are in contact on account of mutual adhesion or support, thus forming especially a volume structure 12 in the fashion of wadding, felt or a yarn. This volume structure 12 results in a very high surface area of the carbon nanotubes 4 and also in a stable mechanical construction. In one specific embodiment it may be provided that the carbon nanostructure-based fibers 3 are at least in regions compressed with one another in order to achieve an even more compact and thus stronger construction which nevertheless leaves open sufficient flow paths for the cooling medium.

Figure 5:
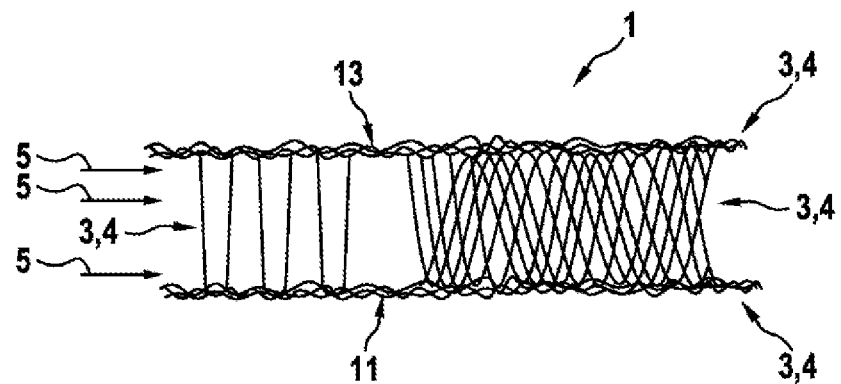
FIG. 5 shows regions of two variants of a heat sink having filaments extending substantially orthogonally to the fiber basis or obliquely to the fiber basis and FIG. 6 shows a region of a heat sink having grid-shaped support structures and looping fibers.

In the exemplary embodiment of FIG. 5 the left-hand side shows a construction such as is already apparent from the left-hand side of FIG. 3, i.e. a construction having individual filaments 10 which are preferably partly incorporated into the fiber basis 11 but have "free regions" in the flow path of the cooling medium, wherein the difference between FIG. 5 and FIG. 3 is that on the side opposite the fiber basis 11 too there is a further fiber basis 13 formed by end regions of the carbon nanostructure-based fibers 3, so that altogether the free fiber regions are supported at both ends and are therefore not deformed by the flow of the cooling medium. The right-hand side of FIG. 5 shows a corresponding example of a heat sink 1 such as is apparent from the left-hand side of FIG. 5, wherein the difference between these two variants however is that on the left-hand side the free fiber regions are especially perpendicular to the flow of the cooling medium 5 and thus substantially orthogonal to the two fiber bases 11 and 13; however on the right-hand side of FIG. 5 these free fiber regions extend obliquely to the flow of the cooling medium, i.e. form an angle with the respective fiber basis 11 or 13 of not equal to 90°. Accordingly, the right-hand side of FIG. 5 has a longer free fiber length compared to the exemplary embodiment on the left-hand side, thus ensuring a larger surface area in the flow of the cooling medium.

Figure 6:
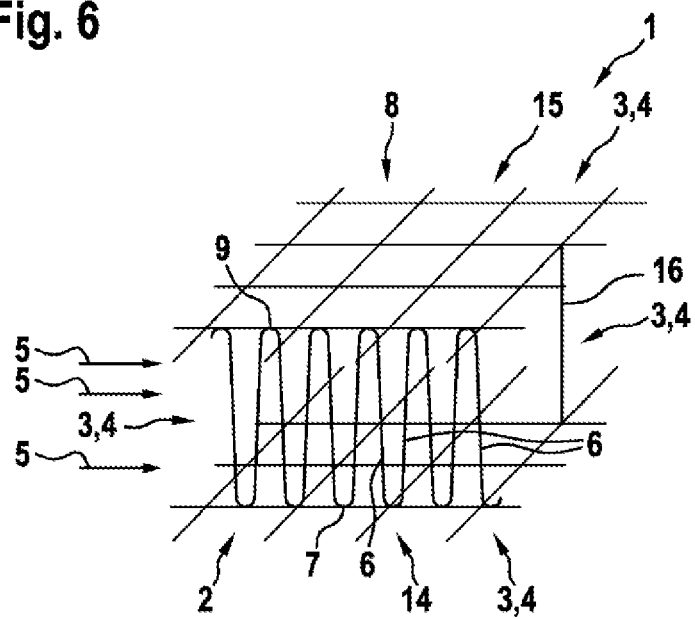

FIG. 6 elucidates an exemplary embodiment of a region of a heat sink 1 which likewise includes a main body 2 and a counterbody 8 but wherein these two components are not shown and instead only a grid-like support structure 14 and 15 is shown, wherein the support structures 14,15 may preferably be formed from carbon nanostructure-based fibers 3, in particular carbon nanotubes 4. These two support structures 14, 15 are secured to the main body 2 and/or counterbody 8 or cast therinto and accommodate end regions 7 and 9 of carbon nanostructure-based fibers 3, in particular carbon nanotubes 4, extending therebetween. The support structures 14 and 15 have a stabilizing effect. They especially improve the securing or the casting. The two support grids 14 and 15 may also be connected to one another. This is effected by means of appropriate joins 16, of which FIG. 6 shows only one by way of example. This maintains the distance between the two support structures 14 and 15. The two support structures 14 and 15 may also be made of metal, i.e. may be metal grids.

It must be noted in connection with all exemplary embodiments that these often show only one carbon nanostructure-based fiber 3 or only very few carbon nanostructure-based fibers 3. It will be appreciated that in the complete respective heat sink 1 a very large number of carbon nanostructure-based fibers 3 is provided especially in three-dimensional arrangement in order to achieve a large surface area.

The exemplary embodiment in FIG. 5 (both left-hand and right-hand side) in each case has an ordered structure of the carbon nanostructure-based fibers 3 which in this case extend substantially parallel to one another. The structure in the working example of FIG. 4 is completely different, namely an unordered structure.

It may moreover be provided in the various working examples that at least some of the carbon nanostructure-based fibers 3 are provided with a mechanically stabilizing coating. This also has the result that the carbon nanostructure-based fibers 3 remain relatively stable in the flow of the cooled medium and do not bend to any great extent. For example a coating of copper or another metal may be provided.

Especially in the working example of FIG. 4 it may also be provided that instead of the volume structure 12 in the form of wadding, felt or a yarn a three-dimensional fabric is present, i.e. the volume structure 12 is woven using carbon nanostructure-based fibers 3 and then at least one-sidedly embedded in a main body 2 or secured thereto, wherein this may alternatively also be effected—as shown in FIG. 4—using a fiber basis 11 which is preferably also prepared as a woven structure from carbon nanostructure-based fibers 3.

The invention claimed is:

1. A heat sink (1) comprising:
a main body (2);
a plurality of carbon nanostructure-based fibers (CNB, 3) of which at least some are secured to the main body (2) for heat transfer;
a counterbody (8) which is a distance away from the main body (2) and has at least some of the fibers (3) secured thereto; and
at least one support structure (14, 15) which supports the fibers (3, 4);
wherein the at least one support structure (14, 15) is grid-shaped and assists the securing to the main body (2) and/or the counterbody (8), and
wherein, due to mutual adhesion or support the fibers (3) form a volume structure (12), or wherein the fibers (3) form loops (6) or a three-dimensional fabric.

2. The heat sink as claimed in claim 1, wherein the fibers (3) at least in regions form an ordered structure and/or at least in regions form an unordered structure.

3. The heat sink as claimed in claim 1, wherein the securing to the main body (2) and/or to the counterbody (8) is in the form of adhesive bonding sites and/or casting sites.

4. The heat sink as claimed in claim 1, wherein the loops (6) comprise end regions (7, 9) and in that at least some of the end regions (7, 9) of the loops (6) are secured to and/or in the main body (2) and/or the counterbody (8).

5. The heat sink as claimed in claim 1, wherein at least some of the fibers (3) are provided with a mechanically stabilizing coating.

6. The heat sink as claimed in claim 1, wherein at least some of the fibers (3) extend from a sheetlike fiber basis (11, 13) formed by the fibers (3) and/or further carbon nanostructure-based fibers (CNB, 3).

7. The heat sink as claimed in claim 6, wherein the fiber basis (11, 13) is secured to/in the main body (2) and/or the counterbody (8).

8. The heat sink as claimed in claim 6, wherein the fiber basis (11, 13) is in the form of a fabric.

9. The heat sink as claimed in claim 1, wherein at least some of the fibers (3) extend from the main body (2) to the counterbody (8) at an angle not equal to 90°.

10. The heat sink as claimed in claim 1, wherein the plurality of carbon nanostructure-based fibers (CNB, 3) are carbon nanotubes (CNT, 4) or graphene fibers.

11. The heat sink as claimed in claim 1, wherein the volume structure (12) is in the form of wadding, felt or yarn.

12. The heat sink as claimed in claim 1, wherein the at least one support structure (14, 15) is made of metal and/or of further carbon nanostructure-based fibers (CNB, 3).

13. The heat sink as claimed in claim 12, wherein the at least one support structure (14, 15) is made of further carbon nanostructure-based fibers (CNB, 3) in the form of carbon nanotubes (CNT, 4) or graphene fibers.

14. The heat sink as claimed in claim 1, wherein the at least one support structure (14, 15) is cast into the main body (2) and/or the counterbody (8).

15. The heat sink as claimed in claim 6, wherein the sheetlike fiber basis (11, 13) is formed by further carbon nanostructure-based fibers (CNB, 3) in the form of carbon nanotubes (CNT, 4) or graphene fibers.

16. The heat sink as claimed in claim 1, wherein at least some of the fibers (3) extend from the main body (2) to the counterbody (8) at an angle of 90°.

17. A heat sink (1) comprising:
a main body (2); and
a plurality of carbon nanostructure-based fibers (CNB, 3) of which at least some are secured to the main body (2) for heat transfer;
wherein at least some of the fibers (3) extend from a sheetlike fiber basis (11, 13) formed by the fibers (3) and/or further carbon nanostructure-based fibers (CNB, 3);
wherein the fiber basis (11, 13) is in the form of a fabric; and
wherein due to mutual adhesion or support the fibers (3) form a volume structure (12), or wherein the fibers (3) form loops (6) or a three-dimensional fabric.

18. A heat sink (1) comprising:
a main body (2);
a plurality of carbon nanostructure-based fibers (CNB, 3) of which at least some are secured to the main body (2) for heat transfer; and
at least one support structure (14, 15) which supports the fibers (3, 4);

wherein the at least one support structure (14, 15) is made of metal and/or of further carbon nanostructure-based fibers (CNB, 3); and wherein due to mutual adhesion or support the fibers (3) form a volume structure (12), or wherein the fibers (3) form loops (6) or a three-dimensional fabric.

19. The heat sink as claimed in claim 18, wherein the at least one support structure (14, 15) is made of further carbon nanostructure-based fibers (CNB, 3) in the form of carbon nanotubes (CNT, 4) or graphene fibers.

* * * * *